Nov. 8, 1960 W. D. DRUKKER ET AL 2,958,869

APPARATUS FOR ATTACHING ELECTRICAL COMPONENTS TO PRINTED WIRING BOARDS

Filed July 23, 1959 4 Sheets-Sheet 1

INVENTORS
W. D. DRUKKER
F. W. TURNER
BY
A. C. Schwarz, Jr.
ATTORNEY

INVENTORS
W. D. DRUKKER
F. W. TURNER
BY a. c. Schwarz, Jr.
ATTORNEY

Nov. 8, 1960 W. D. DRUKKER ET AL 2,958,869

APPARATUS FOR ATTACHING ELECTRICAL COMPONENTS TO PRINTED WIRING BOARDS

Filed July 23, 1959 4 Sheets-Sheet 3

INVENTORS
W. D. DRUKKER
F. W. TURNER
BY
A. C. Schwarz, Jr.
ATTORNEY

INVENTORS
W. D. DRUKKER
F. W. TURNER
BY
A. C. Schwarz, Jr.
ATTORNEY

United States Patent Office 2,958,869

Patented Nov. 8, 1960

2,958,869

APPARATUS FOR ATTACHING ELECTRICAL COMPONENTS TO PRINTED WIRING BOARDS

Willard D. Drukker, Downers Grove, Ill., and Frederick W. Turner, Flemington, N.J., assignors to Western Electric Company, Incorporated, New York, N.Y., a corporation of New York Filed July 23, 1959, Ser. No. 828,988

7 Claims. (Cl. 1—2)

This invention relates to an apparatus for attaching electrical components to printed circuit wiring boards and more particularly to an apparatus for bending the leads of electrical components about the opposite edges of a wiring board to secure the electrical component thereto.

An object of the present invention is to provide an improved apparatus for attaching electrical components to wiring boards.

Another object of the invention is the provision of a novel apparatus for bending the oppositely disposed straight leads of electrical components about opposite edges of a printed wiring board to attach the components to the board.

With these and other objects in view, the invention contemplates the provision of a carrier for supporting the wiring board thereon and feed means for feeding an electrical component onto the board in an operative position with the body of the component resting on the board and having coaxially aligned leads extending from opposite ends thereof parallel to the board and beyond the edges thereof. A pair of presser members above the board are actuated to engage intermediate portions of the leads and press them against the upper marginal portions of the board and a pair of lower shearing members are moved upwardly and cooperate with a pair of downwardly moving upper shearing members to shear the leads to a predetermined length with portions thereof extending beyond the edges of the board. The upper and lower shearing members are then moved downwardly causing the upper shearing members to bend the horizontally projecting ends of the leads downwardly into vertical position in engagement with the edges of the board and with portions of the leads projecting downwardly below the board after which the upper shearing members are elevated and a pair of clinching members are moved horizontally to bend the downwardly projecting end portions of the leads against the underside of the board to clinch the leads to the board and secure the electrical component thereto in engagement with selected conductors on the board.

Other objects and advantages of the invention will become apparent by reference to the following detailed description thereof and the accompanying drawings illustrating a preferred embodiment thereof in which.

Figures 11, 12:
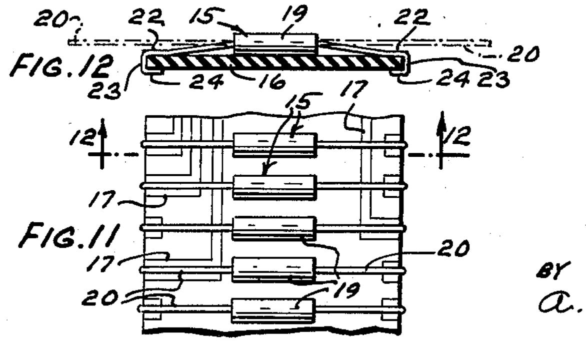

Figs. 5–10, inclusive, are enlarged fragmentary views showing progressive steps of attaching the electrical component to the wiring board;

Fig. 11 is a fragmentary plan view of a wiring board with a plurality of electrical components attached thereto; and Fig. 12 is a cross-sectional view of the wiring board taken along line 12—12 of Fig. 11.

The present apparatus is designed to attach electrical components 15 (Figs. 11 and 12) onto flat printed wiring boards 16 of substantially rectangular outline which are provided with strips 17 of conducting material on one or both sides of the board 16 forming the printed circuit. As shown in Fig. 11 the conducting strips 17 are arranged with portions thereof disposed in spaced relation to each other along the margins of the board 16.

Each electrical component 15 has a body 19 and a pair of straight leads 20 extending from opposite ends thereof along the axis of the body. The component 15 is attached to the wiring board 16 with the body 19 thereof in engagement with the board and with the leads 20 formed to provide portions 22 engageable with the marginal portions of the upper surface of the board, portions 23 engageable with edges of the board and end portions 24 clinched to the bottom of the board to cooperate with the portions 22 to securely attach the components onto the board. The portions 22 or 24 of the leads also engage selected conducting strips 17 and establish electrical connections therewith.

Figure 1:
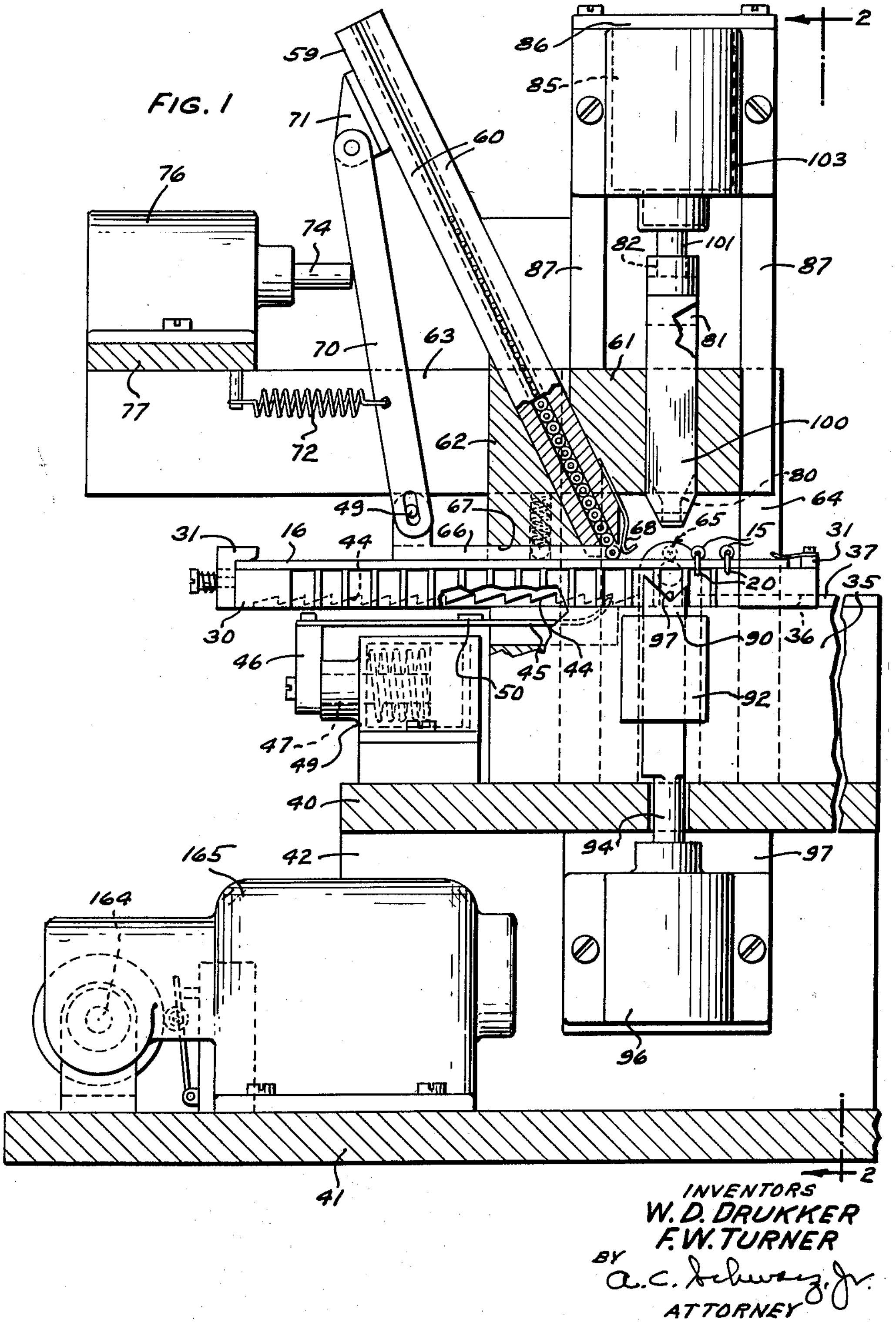
Fig. 1 is a fragmentary vertical longitudinal sectional view of the apparatus.

The apparatus comprises a carrier 30 having a flat upper surface for supporting the wiring board 16 thereon and having clamping elements 31, 31 engageable with the ends of the wiring board for releasably securing the wiring board in a predetermined horizontal position thereon. The carrier 30 is in the form of a slide slidably mounted on the upper surface of a supporting member 35 and having longitudinally disposed guideways 36 for receiving guide tracks 37 on the supporting member 35. The supporting member 35 is secured to a horizontal frame plate 40 which is mounted in spaced relation to a base plate 41 by a plurality of vertical spacing members 42 (Fig. 1).

A longitudinal row of centrally disposed ratchet teeth 44 on the carrier 30 cooperate with a feed pawl 45 in the form of an elongated leaf spring fixed at one end to an arm 46 on a piston rod 47 of a fluid-operated actuator 49. This actuator is mounted on the frame plate 40 and is operable to index the carrier 30 through predetermined distances to present successive portions of the board in operative position for the attachment of electrical components 15 thereto. The feed pawl 45 has a handle 50 by means of which the feed pawl may be manually disengaged from the ratchet teeth 44 to permit the carrier to be moved to a predetermined starting position. Along opposite edges thereof, the carrier 30 is provided with longitudinally spaced recesses 52 which provide clearance for the clinching of the end portions 24 of the leads against the underneath side of the board and which are separated from each other by fingers 53 for supporting the marginal portions of the board during the application of the electrical components thereto.

Figure 3:
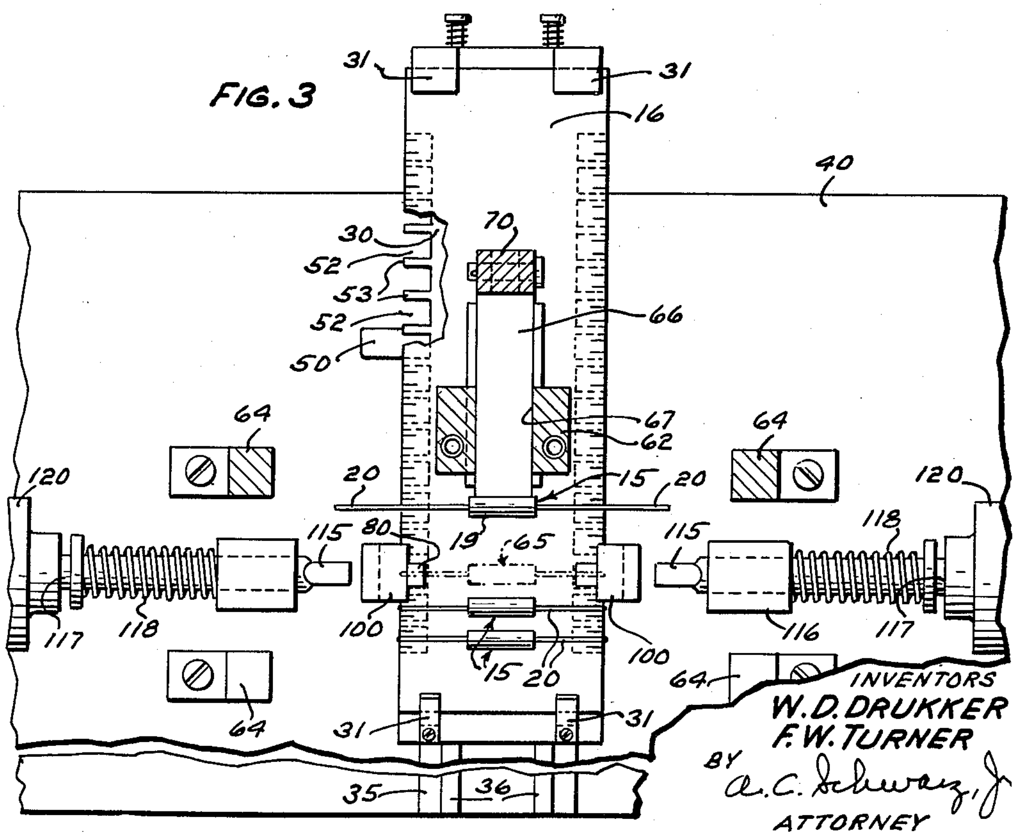
Fig. 3 is a fragmentary plan sectional view of the apparatus taken along line 3—3 of Fig. 2.

A supply of the components 15 is placed in a hopper 59 comprising a pair of obliquely disposed plates 60 provided with a central aperture for receiving the bodies 19 of the components and having reduced laterally extending slots for receiving the leads 20 thereof. The plates 60 of the hopper 59 are secured to frame members 61 and 62 extending between a pair of horizontally disposed bars 63 which are supported by a plurality of vertical posts 64 extending upwardly from the frame plate 40. The lowermost component 15 is adapted to rest on the wiring board 16 on the carrier 30 and is adapted to be advanced to a predetermined operative position 65 by a feed plunger 66 (Figs. 1 and 3) which is slidably supported in a slideway 67 in the frame member 62.

A spring 68 mounted on the lower end of the hopper 59 serves to yieldably retain the lowermost component 15 in the lower end of the magazine while permitting movement thereof from the magazine to its operative position in response to the actuation of the feed plunger 66.

At one end thereof, the feed plunger 66 is connected through a pin and slot connection 69 to one end of a lever 70, the other end of which is pivotally supported on a bracket 71 on the magazine 59. A spring 72 stresses the lever 70 for movement to the left as viewed in Fig. 1 and serves to return the feed plunger 66 to a normal retracted position, and a plunger 74 operated through a predetermined stroke by a fluid-operated actuator 76 serves to effect the forward movement of the feed plunger 66 to advance successive components 15 to operative position. The actuator 76 is mounted on a plate 77 extending between the horizontal bars 63.

Figure 7:
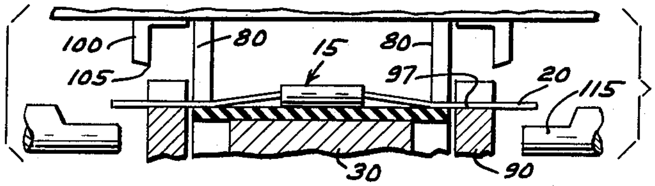

A component 15 in the operative position 65 is in vertical alignment with a pair of presser and forming arms 80 which are slidably mounted in guideways in the frame members 61 and form part of a U-shaped presser member 81. This presser member 81 is connected to a piston 82 which is reciprocated through a predetermined distance by a fluid-operated actuator 85. The actuator 85 is secured to a plate 86 which is supported on a pair of vertical frame plates 87 fixed to the frame member 61. As the actuator 85 moves the presser member 81 downwardly the arms 80 move from a normal upper position and engage the intermediate portions 22 of the leads 20 and press them tightly against the upper surface of the marginal portions of the board 16, as shown in Fig. 7, to yieldably clamp the leads 20 thereagainst.

Figure 2:
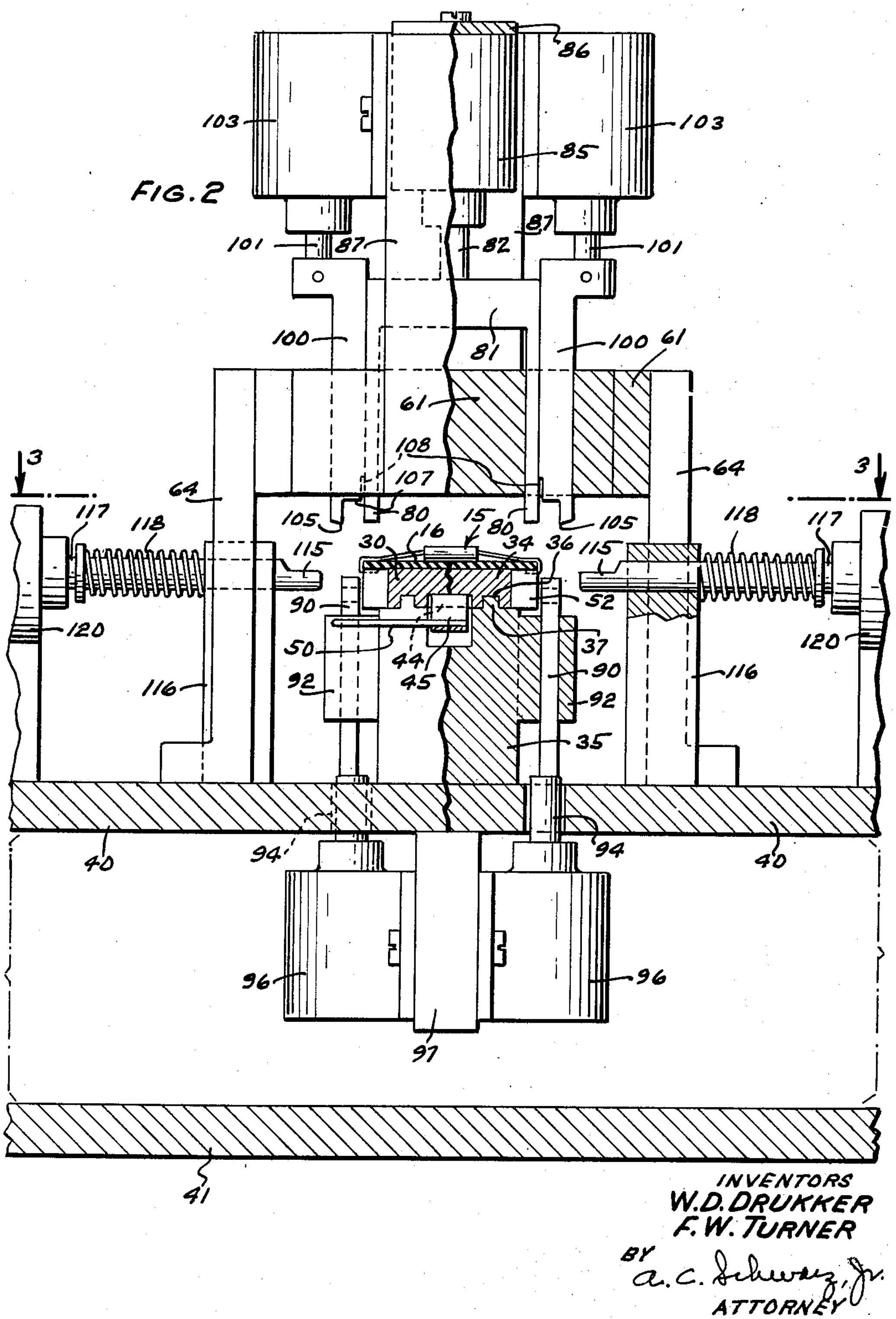
Fig. 2 is a vertical cross-sectional view of the apparatus taken substantially along line 2—2 of Fig. 1 with portions broken away.
Figure 6:
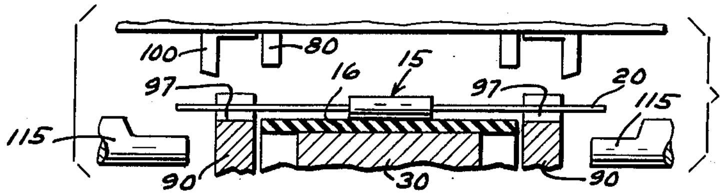

A pair of lower shearing members 90 are slidably mounted in guideways in guide members 92 on the support 35 (Fig. 2) and these shearing members 90 are carried by plungers 94 which extend through apertures in the frame plate 40 and are operated through a predetermined vertical distance by fluid-operated actuators 96. The actuators 96 are secured to a frame member 97 fixed to and extending downwardly from the frame plate 40. The upper end of the lower shearing members 90 have V-shaped notches 97 (Fig. 1) in the upper ends thereof, the bottom portions of which are aligned with the top surface of the board 16 when the lower shearing members are raised to their upper position as shown in Fig. 6. In this position of the lower shearing members 90 the V-shaped notches 97 serve to accurately position the leads 20 relative to the board 16 and the selected conductor strips 17 thereon.

Figure 8:
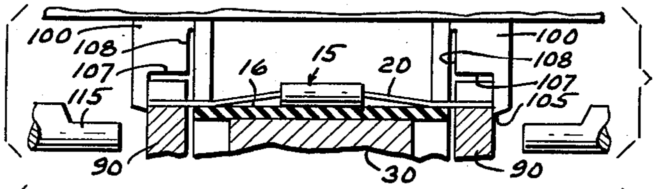
Figure 9:
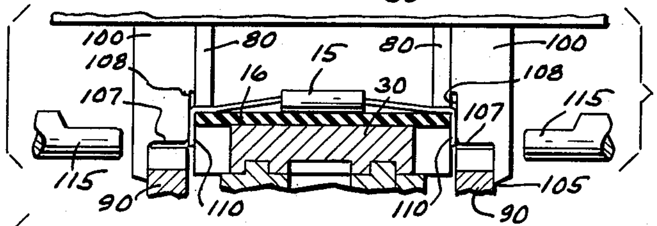
Figure 10:
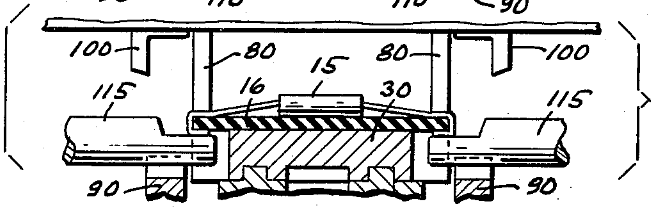

A pair of upper shearing members 100 are slidably mounted in the frame member 61 adjacent the presser arms 80 and are connected to pistons 101 of fluid-operated actuators 103 which are secured to the vertical frame plates 87. Shearing edges 105 on the upper shearing members 100 cooperate with the lower shearing members 90 to shear the leads 20 at points located a predetermined distance from the edges of the wiring board 16 and thus provide leads of predetermined length with end portions thereof projecting predetermined distances beyond the wiring board. After the leads 20 have been sheared, the lower shearing members 90 are lowered and the upper shearing members 100 continue their movement downwardly, and horizontal and vertical forming surfaces 107 and 108, respectively (Figs. 8 and 9) on the upper shearing members 100 serve to bend the horizontally projecting end portions of the leads downwardly into vertical position to form parallel ends 110 in engagement with the edges of the board 16 and with portions thereof projecting downwardly below the board as shown in Fig. 9. The upper shearing members 100 are then raised to their normal upper positions while the presser members 80 retain the leads 20 in firm engagement with the wiring board.

Portions 24 of the ends 110 of the leads projecting downwardly below the board 16 are then bent into engagement with the lower surface of the wiring board 16 by a pair of clinching members 115 which are slidably mounted in brackets 116 on the frame 40. The clinching members 115 are connected to pistons 117 which are actuated to a retracted position by springs 118 and are actuated to a forward position by a fluid-operated actuator 120 supported on the frame plate 40 to clinch the ends of the leads against the underside of the board 16. The electrical components 15 are thus securely attached to the board with the opposed leads 20 of the component in engagement with conducting strips 17 of the board to establish an electrical connection therewith, and with the body 19 of the component 15 resting on the board 16.

Figure 4:
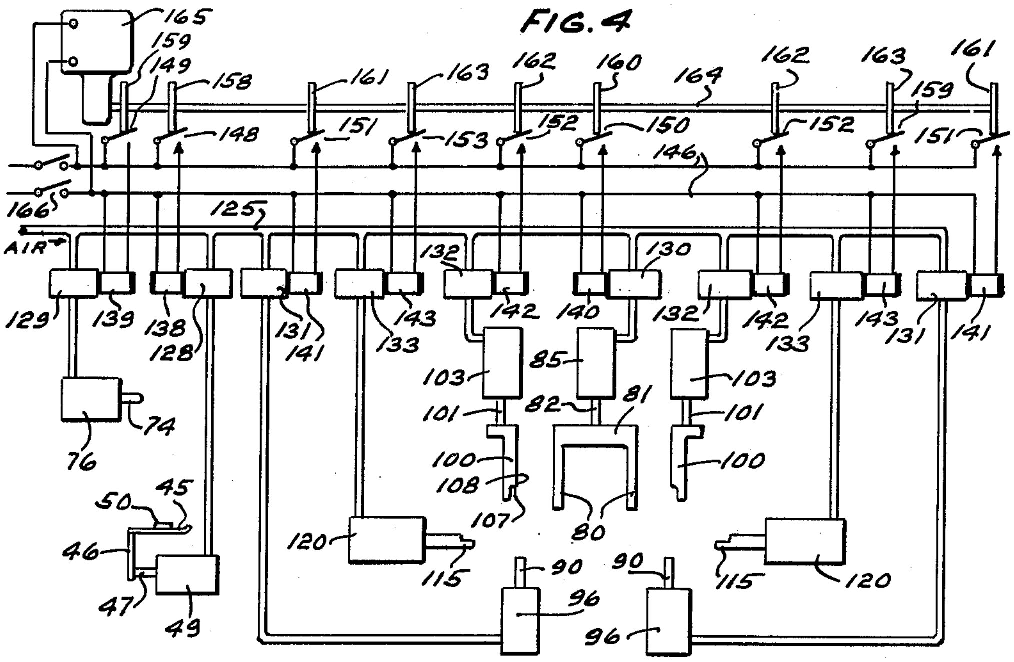
Fig. 4 is a diagrammatic view of the actuating and control mechanism of the apparatus.

The actuators 49, 76, 85, 96, 103 and 120 shown in Fig. 4 are spring actuated to their normal retracted positions and are power actuated to their forward positions by the admission of compressed air thereinto from a source of supply 125 under control of valves 128–133, respectively. These valves are spring stressed to normal closed positions and are actuated to open positions by solenoids 138–143, respectively which are connected to a power source 146 in series with switches 148–153 and under control of a switch 166. These switches are actuated to effect a predetermined sequential operation of the actuators by cams 158–163 mounted on a cam shaft 164 which is driven by a motor 165.

Figure 5:
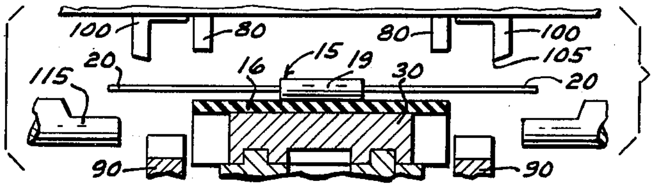

In the operation of the apparatus, the operator, after filling the magazine 59 with electrical components 15, places a wiring board 16 on the carrier 30 and secures it thereto in a predetermined position with the clamping elements 31 and then moves the carrier to its starting position with one end of the board adjacent the presser members 80. The operator then closes the switch 166 which starts the operation of the apparatus and causes the actuator 49 to index the carrier 30 and advance the board 16 to a predetermined position after which the actuator 76 reciprocates the plunger 66 to feed the lowermost component 15 from the magazine 50 to its operative position 65 (Fig. 1) on the board 16 in alignment with the presser members 80, the shearing members 90, the shearing and forming members 100, and the clinching members 15 as shown in Fig. 5.

The lower shearing members 90 are then raised by the actuators 96 to their upper positions as shown in Fig. 6 after which the presser members 80 are lowered by the actuator 85 to engage the intermediate portions of the leads 20 and move them downwardly to effect the seating of the leads 20 in the centering recesses 97 of the lower shearing members 90 and to press portions of the leads 20 against the upper marginal surfaces of the wiring board 16. The upper shearing and forming members 100 are then moved downwardly by the actuators 103 to shear the leads 20 to a predetermined length in cooperation with the lower shearing members 90 (Fig. 8). After the leads have been sheared, the lower shearing members 90 are retracted to their lower positions and the upper shearing and forming members 100 continue their downward movement to bend the horizontally projecting ends of the leads downwardly (Fig. 9) about the side edges of the wiring board 16 after which the shearing and forming members 100 are retracted to their upper positions. The clinching members 115 are then advanced by the actuators 120 to bend the downwardly projecting ends of the leads 20 under the board 16 into tight engagement therewith to clinch the leads to the board and thus secure the component 15 thereto.

During the shearing and forming of the leads 20, the presser members 80 clamp the leads 20 to the board 16 and after the ends of the leads 20 have been clinched to the board and the clinching members retracted, the presser members 80 are raised to their upper positions thus completing one cycle of operation. Successive cycles of operation follow during which successive electrical components 15 are attached to the wiring board 16, and when a predetermined number of the components have been attached to the board, the switch 166 is opened by the operator or by other means to stop the apparatus and permit the unloading of the wiring board 16 with the electrical components 15 attached thereto.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. In an apparatus for attaching electrical components to printed circuit wiring boards wherein the electrical components have leads extending from opposite ends thereof and the boards have electrical conductors along the edges thereof, means for supporting the board with a component positioned thereon with its leads extending laterally above and beyond opposite edges of the board in alignment with selected conductors thereon, means engageable with intermediate portions of the leads for pressing and deforming them against the marginal upper surfaces of the board, and means for bending the projecting ends of the leads around the edges of the board and in engagement with the bottom surface thereof to securely attach the component to the board with leads in contact with the conductors.

2. In an apparatus for attaching electrical components to printed circuit wiring boards wherein the electrical components have leads extending coaxially from opposite ends thereof, means for supporting the board with a component positioned thereon with leads extending laterally above and beyond opposite edges of the board, means engageable with intermediate portions of the leads for pressing and deforming them against the margins of the upper surface of the board, means for shearing the leads at points spaced a predetermined distance from the edges of the board, and means for bending the projecting ends of the leads around the edges of the board and in engagement with the bottom surface thereof to securely attach the component to the board.

3. In an apparatus for attaching electrical components to printed circuit wiring boards wherein the electrical components have leads extending coaxially from opposite ends thereof and the boards have electrical conductors spaced along the margins thereof, means for supporting a wiring board, means for positioning the component in a predetermined position on the board with the leads extending laterally above and beyond opposite edges of the board in alignment with selected conductors, means engageable with intermediate portions of the leads for pressing and deforming them against the upper surface of the board adjacent the edges thereof, means for shearing the leads predetermined distances from the edges of the board, means for bending the projecting ends of the leads downwardly against the edges of the board, means for clinching the ends of the leads against the under side of the board to securely attach the component to the board with the leads in engagement with selected conductors, and means for sequentially actuating said pressing means, said shearing means, said bending means and said clinching means.

4. In an apparatus for attaching electrical components having leads extending from opposite ends thereon onto printed circuit wiring boards having electrical conductors spaced along the margins thereof, a pair of presser members engageable with intermediate portions of the leads, mounting means for supporting the presser members for movement along a predetermined path, means on said mounting means for supporting a wiring board with selected conductors in a predetermined position in the path of movement of said presser members, means for positioning a component in a predetermined location on the wiring board with the intermediate portion of the leads aligned with the conductors in the path of said presser members, means for actuating the presser members to press and deform the intermediate portions of the leads against the upper marginal surfaces of the wiring board, a pair of lower shearing members slidable on said mounting means, a pair of upper shearing and forming members slidable on said mounting means and cooperable with said lower shearing members for shearing the leads and for bending the end portion of the leads against the edges of the wiring board, means for actuating the lower shearing members and the upper shearing and forming members in timed relation to the presser members, a pair of clinching members slidable on said mounting means for bending the ends of the leads into engagement with the lower side of the board to secure the component to the board with the leads in engagement with the selected conductors, and means for actuating said clinching members in timed relation to said presser members.

5. In an apparatus for attaching electrical components having leads extending from opposite ends thereon onto printed circuit wiring boards, a pair of presser members engageable with intermediate portions of the leads, mounting means for supporting the presser members for movement along a predetermined path, means on said mounting means for supporting a wiring board in a predetermined position in the path of movement of said presser members, means for positioning a component in a predetermined location on the wiring board with the leads extending beyond opposite edges of the board and with the intermediate portion of the leads in the path of the presser members, means for actuating the presser members to press and deform the intermediate portions of the leads against the upper marginal surfaces of the wiring board, a pair of lower shearing members movable on said mounting means to an operative position and having notches therein for receiving the leads and locating them in predetermined positions in alignment with selected conductors on the board, a pair of upper shearing and forming members slidable on said mounting means and cooperable with said lower shearing members for shearing the leads and for bending the end portion of the leads transversely of the wiring board against the edges thereof, means for actuating the lower shearing members and the upper shearing and forming members, a pair of clinching members slidable on said mounting means for bending the ends of the leads into engagement with the lower side of the board to secure the component to the board, and means for actuating said clinching members.

6. In an apparatus for attaching electrical components onto wiring boards wherein the electrical components have leads extending from opposite ends thereof and the wiring boards have electrical conductors spaced along the margins thereof, a pair of presser members engageable with intermediate portions of the leads, mounting means for supporting the presser members for movement along a substantially vertical path, a carrier slidably mounted on said mounting means for supporting a wiring board in a predetermined position in the path of movement of said presser members, means for indexing said carrier and the wiring board thereon to position successive conductors in alignment with said presser members, a magazine for holding an upwardly directed row of components above said carrier and with the leads extending beyond the edges of the wiring board on said carrier, means for moving the lowermost component from the magazine and positioning it on the wiring board with the intermediate portions of the leads in the path of said presser members, means for actuating said presser members to press and form intermediate portions of the leads against the wiring board, a pair of lower shearing members slidable on said mounting means, a pair of upper shearing and forming members slidable on said mounting means and cooperable with said lower shearing members for shearing the leads to a predetermined length and for bending the end portions of the leads downwardly against the edges of the wiring board, a pair of clinching members slidable on said mounting means for clinching the ends of the leads against the bottom of the board, and means for sequentially actuating said component-positioning means, said carrier-indexing means, said lower shearing members, said upper shearing and forming members, and said clinching members.

7. In an apparatus for attaching electrical components to printed circuit wiring boards wherein the electrical components have leads extending coaxially from opposite ends thereof, a carrier for supporting the wiring board thereon, mounting means for supporting the carrier for horizontal movement along a predetermined path, means for feeding successive components onto the board and into a predetermined operative position relative to the mountnig means and with the leads extending beyond the edges of the board, a pair of presser members slidably mounted on the mounting means above a component in said operative position engageable with intermediate portions of the leads, means for actuating the presser members in timed relation to said feeding means to press and deform the intermediate portion of the leads against the upper surface of the wiring board adjacent the edges thereof, a pair of lower shearing members slidably mounted on said mounting means, a pair of upper shearing and forming members slidably mounted on said mounting means for cooperation with said lower shearing members to shear the leads a predetermined distance from the edges of the boards, said upper shearing and forming members having forming surfaces for bending the projecting ends of the leads downwardly against the edges of the board and with portions of the leads extending below the board, means for actuating the lower shearing members and the upper shearing and forming members in timed relation to the actuation of the pressing member to effect the shearing and bending of the leads, a pair of clinching members slidably mounted on said mounting means for clinching the ends of the leads against the lower side of the board to secure the components to the board, means for actuating said clinching members in timed relation to the actuation of said shearing members, means for indexing said carrier in timed relation to the actuation of said clinching members, and means for actuating said component feeding means in timed relation to the actuation of said indexing means.

No references cited.